United States Patent
Lille et al.

(10) Patent No.: US 8,128,830 B2
(45) Date of Patent: Mar. 6, 2012

(54) LABELING AN IMPRINT LITHOGRAPHY TEMPLATE

(75) Inventors: Jeffrey S. Lille, Sunnyvale, CA (US); Scott A. MacDonald, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 288 days.

(21) Appl. No.: 12/561,470

(22) Filed: Sep. 17, 2009

(65) Prior Publication Data

US 2011/0064914 A1 Mar. 17, 2011

(51) Int. Cl.
*B44C 1/22* (2006.01)
*C25F 3/00* (2006.01)

(52) U.S. Cl. .......................... 216/40; 216/12

(58) Field of Classification Search ............ 216/40
See application file for complete search history.

(56) References Cited

U.S. PATENT DOCUMENTS

| | | | |
|---|---|---|---|
| 4,632,884 A | 12/1986 | Shikatani et al. | |
| 5,463,200 A * | 10/1995 | James et al. | 219/121.68 |
| 5,877,064 A | 3/1999 | Chang et al. | |
| 6,174,222 B1 | 1/2001 | Sato et al. | |
| 6,235,637 B1 | 5/2001 | Chen et al. | |
| 6,913,870 B2 * | 7/2005 | Werner et al. | 430/311 |
| 7,015,064 B1 | 3/2006 | Patwardhan et al. | |
| 2005/0148181 A1 | 7/2005 | Koyata et al. | |
| 2005/0148196 A1 * | 7/2005 | Sharma et al. | 438/745 |

FOREIGN PATENT DOCUMENTS

| | | |
|---|---|---|
| EP | 1806770 | 11/2007 |
| JP | 55-181338 | 12/1980 |
| JP | 56-24147 | 3/1981 |
| JP | 61-158944 | 10/1986 |
| JP | 10-256195 | 9/1998 |
| JP | 2002222746 | 8/2002 |
| JP | 2003209032 | 7/2003 |
| KR | 2005008057 | 1/2005 |
| KR | 2006072160 | 6/2006 |

* cited by examiner

*Primary Examiner* — Binh X Tran
*Assistant Examiner* — Thomas Pham
(74) *Attorney, Agent, or Firm* — Duft Bornsen & Fishman, LLP

(57) ABSTRACT

Embodiments herein provide relatively permanent labeling of an imprint lithography template. The imprint lithography template generally has first and second sides, one side having a pattern to imprint a substrate and the other being optically smooth to unobstructably pass UV light. In one embodiment, a method of labeling the imprint lithography template includes placing a masking layer on a portion of the first side (e.g., the optically smooth side) of the template, forming a liftoff layer on the remainder of the first side of the template, removing the masking layer to expose the portion of the first side of the template, and placing a polymer mark on the exposed portion of the first side of the template. The method also includes depositing an opaque material on the first side of the template and removing the liftoff layer and the mark to form a label on the first side of the template with the deposited opaque material.

19 Claims, 8 Drawing Sheets

LABELING AN IMPRINT LITHOGRAPHY TEMPLATE

BACKGROUND OF THE INVENTION

1. Field of the Invention

The invention relates to the field of imprint lithography and, in particular, to labeling an imprint lithography template prior to use within an imprint lithography machine.

2. Statement of the Problem

Imprint lithography involves applying a photo-curable liquid resist, or "photoresist", onto a substrate with a mold, commonly referred to as an imprint lithography template. The template is generally made of a transparent material like quartz. After the template and the substrate are pressed together, the photoresist is cured by propagating UV light and/or heat through the template. The photoresist material that is exposed to the light becomes solid to pattern the substrate on a very small scale (e.g., 10 nm or less). After template separation, the pattern consists of the features in relief from a residual layer of photoresist, which may then be removed by an etch process to leave only the pattern features in the substrate.

The overall process of imprint lithography involves several steps, including surface preparation, photoresist coating, mask alignment, exposure, and excess photoresist removal. Because of the delicacy of the process, care is taken when preparing a surface for lithography. Surface contaminants are cleaned to ensure proper imprinting on the substrate. To remove the contaminants, the surface is soaked and rinsed. The surface is then primed with more chemicals to aid in the photoresist adhesion. After the surface is cleaned and primed, the photoresist is applied. Optimization is needed to apply the photoresist uniformly. The photoresist bonds uniformly to the surface. An optional pre-bake process includes heating the substrate in a convection oven or through a heated plate placed below the surface. The purpose of the pre-bake is to evaporate the excess coating solvent and to compact and harden the photoresist; however, not all imprint resists require a pre-bake. The lithography template is then aligned with the substrate. The molecules in the photoresist that are subjected to the UV light and/or heat are bonded strongly together in long chains via polymerization. The post bake process may be used to stabilize and harden the photoresist and remove traces of development chemicals from the substrate. Etching may then be used to remove the excess photoresist including a thin layer of resist between imprinted features.

Delicate alignment of the mask with respect to the substrate is necessary to ensure that the pattern is properly transferred. Moreover, the lithography template also requires delicate handling so as to not scratch the template because scratches transfer into the substrate as a defect. Generally, the template is prepared for the lithography process by placing the template in a lithography machine. If the template is placed in the lithography machine incorrectly (e.g., wrong side up), the template may scratch, thereby destroying the usefulness of the template. However, knowing which side of the template is to face the substrate is difficult as the template is transparent with no visible markings. One way to ensure that the template is properly placed in the lithography machine is to single handedly follow the template from the point of manufacture to its ultimate placement in the lithography machine. Such is generally not practical as there are many people, templates, lithography machines, etc. involved in the lithography process. Another manner to ensure that the template is properly processed and placed in the lithography machine includes marking the template in a boundary area that does not interfere with the UV light lithography such that the handler knows which side is up. For example, if the wrong side is up when being placed in the lithography machine, the handler knows because the marking appear backwards through the transparent template. However, present methods of marking are not permanent and the marks are removed due to the harsh chemicals that are used to clean the template after the lithography process. Thus, when the template is used again in a lithography machine, proper placement becomes an issue. Alternatively, the template may be etched with a laser or other etching means. Etching the template adds complication and may be acceptable as long as no particles or protrusions are created in the template surface. Accordingly, there exists a need to provide a relatively permanent label to the template that assists in preventing damage to the template during handling and does not create particles or protrusions on the imprint surface of the transparent template.

SUMMARY

Embodiments herein provide relatively permanent labeling an imprint lithography template. The imprint lithography template generally has first and second sides, one side having a pattern to imprint a substrate (e.g., a front side) and the other being optically smooth (e.g., a back side) where the template can unobstructably pass UV light. In one embodiment, a method of labeling the imprint lithography template includes placing a masking layer on a portion of the first side (e.g., the optically smooth back side) of the template, forming a liftoff layer on the remainder of the first side of the template, removing the masking layer to expose the portion of the first side of the template, and placing a polymer mark (e.g., indelible ink) on the exposed portion of the first side of the template. The method also includes depositing an opaque material (e.g., an alloy) on the first side of the template and removing the liftoff layer and the polymer mark to form a label on the first side of the template with the deposited opaque material. For example, by removing the liftoff layer and the polymer mark, the opaque material is removed from the non label area of the template and from the area over the polymer mark. The opaque material, however, remains in the label area outside the polymer mark to leave behind a negative image of the polymer mark.

In another embodiment, a method of labeling the imprint lithography template includes cleaning both sides of the template to prepare the template for label processing, forming a polymer layer (e.g., polymethyl methacrylate or "PMMA") on the patterned side of the template to protect the pattern during the label processing, and masking a portion of the optically smooth side of the template with cellophane tape. The method also includes forming a polymer layer (e.g., polymethyl methacrylate) on the remainder of the optically smooth side of template to protect the remainder of the optically smooth side of the template during the label processing, removing the tape (and any residue thereof) to expose the portion of the optically smooth side of the template, and placing an ink mark on the exposed portion of the optically smooth side of the template. The method also includes an optional covering of the remainder of the optically smooth side of the template with a metal foil, depositing a metallic layer on the exposed portion of the optically smooth side of the template, removing the metal foil after depositing the metallic layer, and cleaning both sides of the template to remove the polymer layers and the ink mark to reveal the label with the deposited metallic layer.

Depositing the metallic layer on the exposed portion of the optically smooth side of the template may include sputtering tantalum and nickel-iron on the exposed portion of the optically smooth side of the template. For example, a first tantalum layer of about 50 angstroms may be sputtered on the exposed portion of the optically smooth side of the template followed by a nickel-iron layer of about 100 angstroms on the first tantalum layer and a second tantalum layer of about 50 angstroms on the nickel-iron layer.

Cleaning both sides of the template to prepare the template for label processing may include cleaning the template with N-methylpyrrolidone (NMP) and isopropanol (IPA), rinsing the template, and spin-drying the template. Cleaning both sides of the template to remove the photoresist layers and the ink mark to reveal the label may include cleaning the template with N-methylpyrrolidone and isopropanol, rinsing the template, and spin-drying the template. In response to cleaning, rinsing, and spin-drying to reveal the label, the cleaning may further include soaking the template in a chemical solution, rinsing the template, and spin-drying the template.

Other exemplary embodiments may be described below.

DESCRIPTION OF THE DRAWINGS

Some embodiments of the present invention are now described, by way of example only, and with reference to the accompanying drawings. The same reference number represents the same element or the same type of element on all drawings.

DESCRIPTION OF THE EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below, but by the claims and their equivalents.

Figure 1:
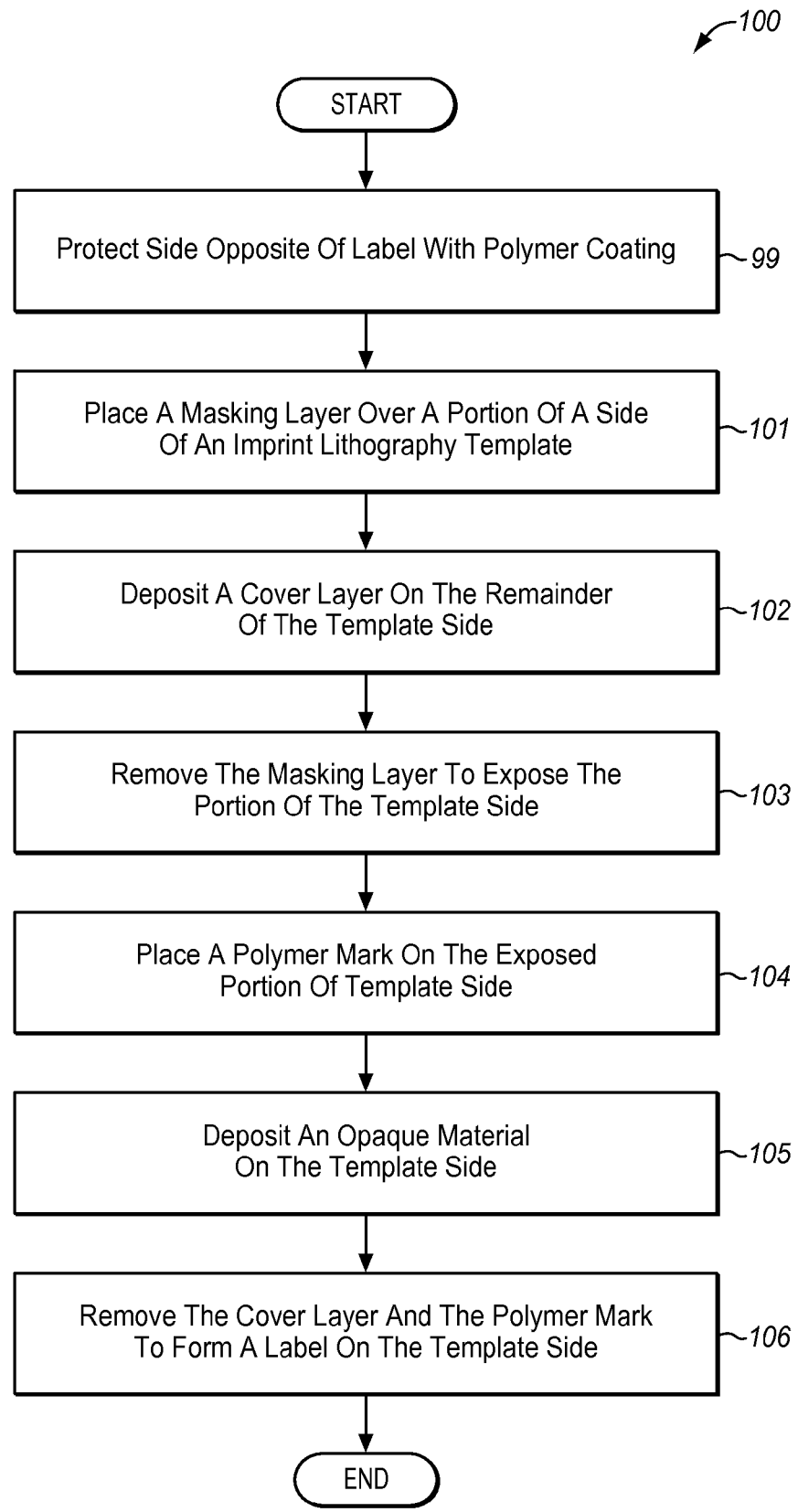
FIG. 1 is a flow chart illustrating a method of labeling an imprint lithography template in one exemplary embodiment.

FIG. 1 is a flow chart illustrating a method 100 of labeling an imprint lithography template in one exemplary embodiment. The method 100 will be discussed in relation to the imprint lithography template 200 shown in FIGS. 2-8. The steps of the flow chart in FIG. 100 are not all inclusive and may include other steps not shown.

Figure 2:
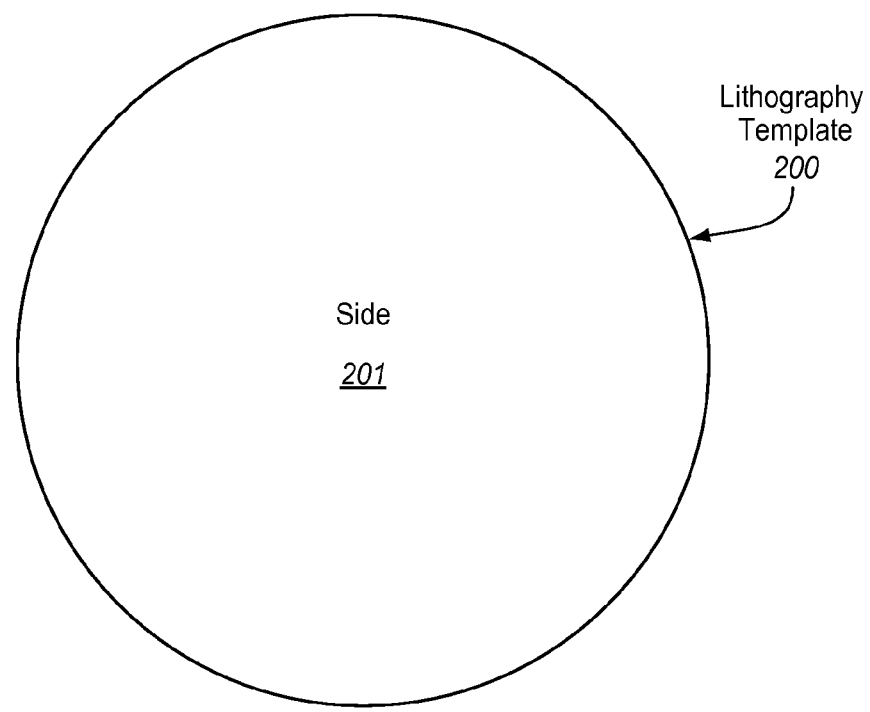
FIGS. 2-8 illustrate an imprint lithography template being labeled according to the method of FIG. 1 in one exemplary embodiment.

Once the imprint lithography template 200 of FIG. 2 is ready for use within the imprint lithography machine, the template 200 is labeled so as to assist the operator with its proper usage and thereby prevent damage to the template 200. First, the template 200 has the surface opposite of the label coated with a protective sacrificial polymer coating in step 99.

Figure 3:
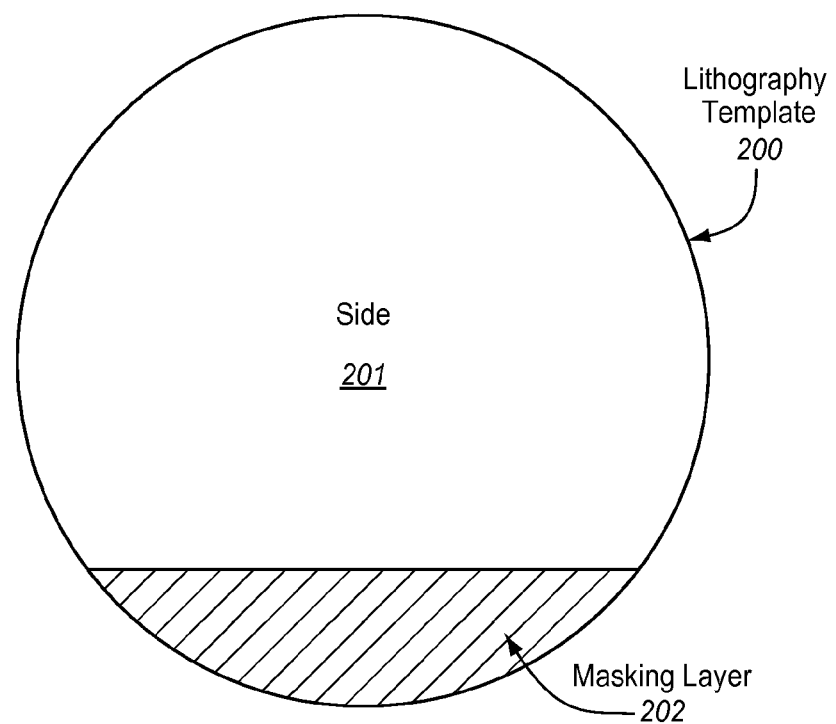

The method 100 then continues by protecting the label surface (i.e., side 201) and placing a masking layer 202 over a portion of a side 201 of the imprint lithography template 200 in step 101. For example, a film, such as cellophane tape, may be affixed to a boundary portion of the template side 201 to protect that portion of the template side 201 where the label will be affixed, as shown in FIG. 3. The boundary portion of the template 200 may be that area of the template 200 where no pattern exists, either on the side 201 or on the opposite side.

Figure 4:
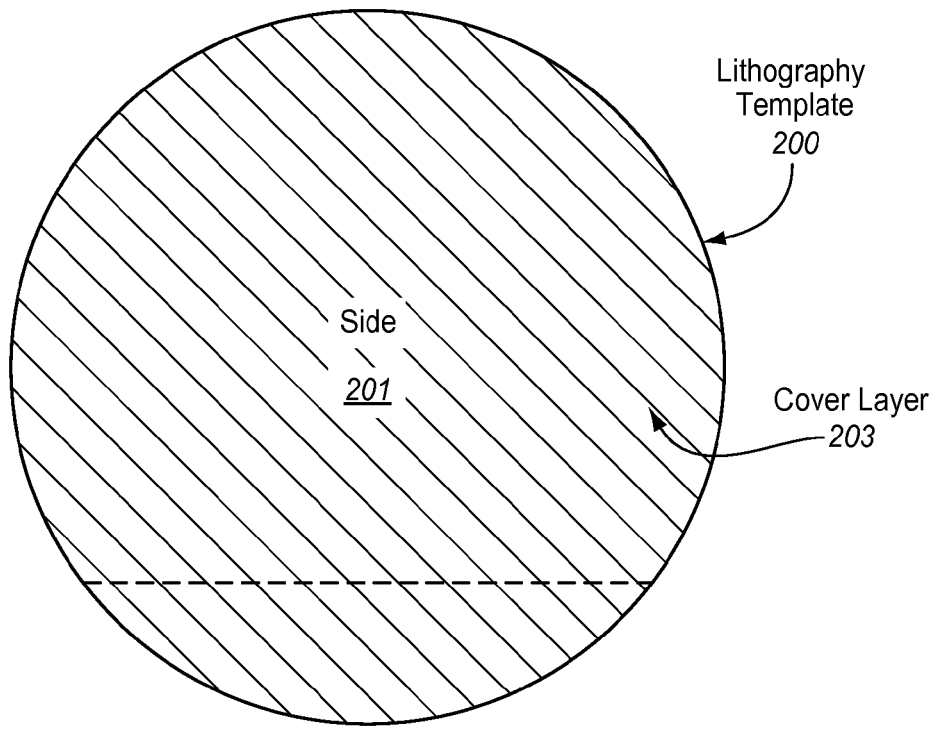

In step 102, a material is deposited on the remainder of the template side 201 as a cover layer 203 as shown in FIG. 4. For example, a polymer material may be deposited on the template side 201 and baked to affix the polymer material to the template side 201. This cover layer 203 may serve as a liftoff material that protects the template side 201 during the labeling process. Since the masking layer 202 is used to mask off the portion of the template side 201, the cover layer 203 may be deposited on all of the template side 201 or just that remainder not covered by the masking layer 202.

Figure 5:
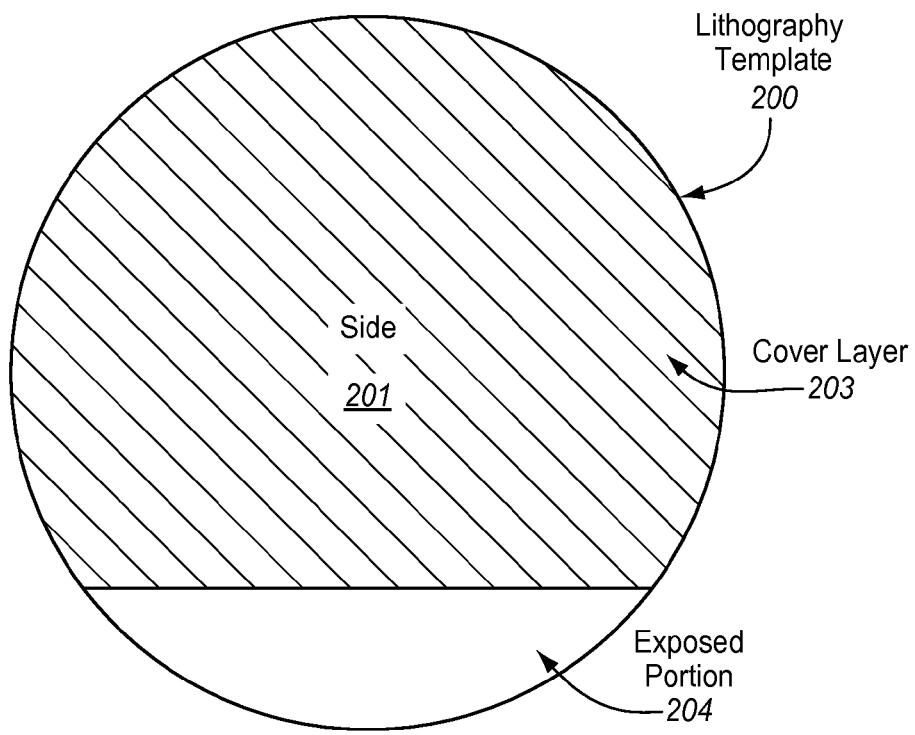

After the cover layer 203 deposition, the masking layer 202 is removed to expose a portion of the template side 201 in step 103 as illustrated with the exposed portion 204 in FIG. 5. Alternatively, one could use photolithography to expose a portion of the templates side 201 and develop a region 204. This exposed portion 204 of the template side 201 is the location in which the label is formed on the template side 201.

Figure 6:
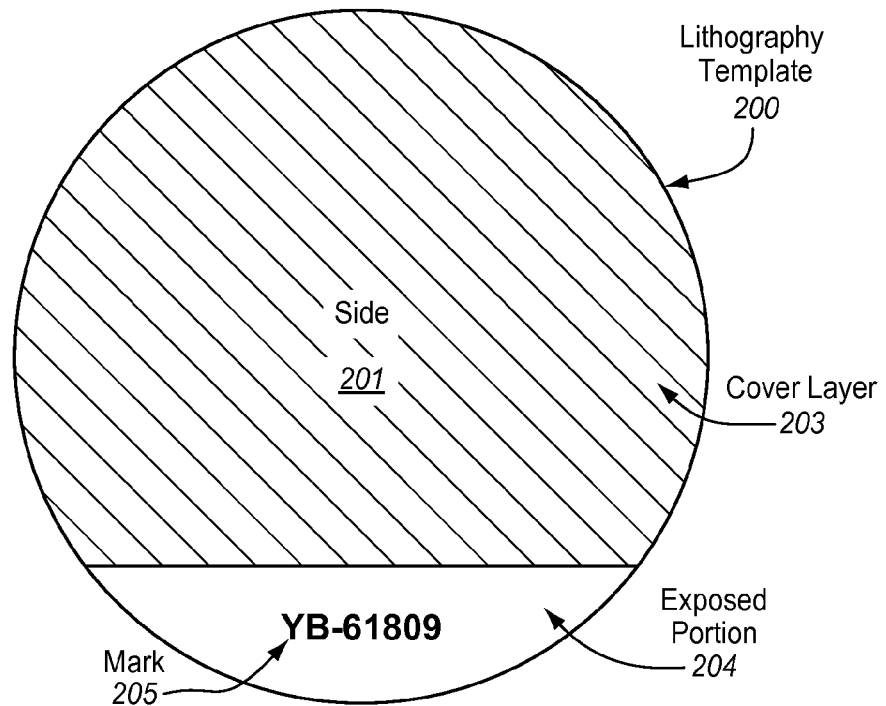

In this regard, a polymer mark may be placed on the exposed portion 204 of the template side 201 in step 104 as illustrated by the mark 205 of the exposed portion 204 in FIG. 6. For example, an indelible ink marker may be used to write on the exposed portion of the template side 201 to temporarily label the template side 201. Generally, the polymer mark that is applied to the template side 201 includes various combinations of numbers and letters that readily illustrate which of the template sides is "up" to the operator. For example, the imprint photography template 200 is transparent. As such, certain letters and/or numbers written on the template side 201 appear backwards when viewing from the opposite side, thereby indicating that the template side 201 should be up and accordingly placed in the imprint lithography machine. The term "up" is, of course, reference dependent as the template 200 may be placed in the imprint lithography machine in other ways. The term up, therefore, is merely intended to indicate one exemplary point of reference. Additionally, the invention is not intended to be limited to any type of mark 205, such as a bar code or symbol more compatible with automated handling. As shown herein, the lithography template 200 is labeled "YB-61809" indicating a title for the wafers/substrates to be imprinted by the imprint lithography template 200. However, marking of the imprint lithography template 200 is simply a matter of design choice.

Figure 7:
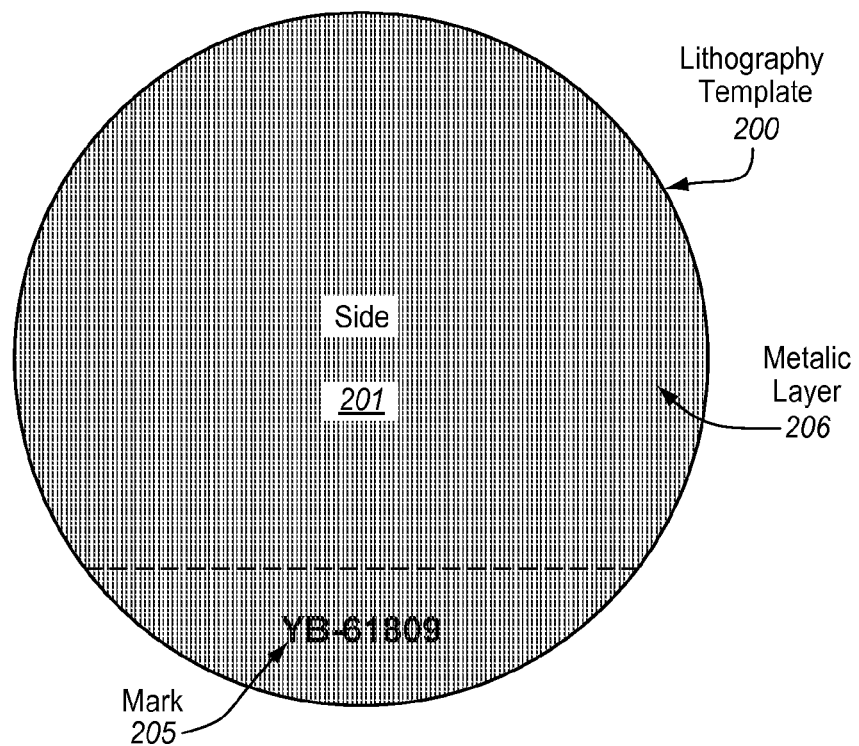

After the template side 201 is marked with the mark 205, an opaque material is deposited on the template side 201 in step 105 as illustrated with the opaque layer 206 in FIG. 7. For example, an alloy may be sputtered upon the template side 201 over the mark 205. Thereafter, the cover layer 203 and the mark 205 may be removed in step 106 to form a label 210 on the template side 201. For example, a sputtered alloy may not adhere properly to the mark 205. Accordingly, when the cover layer 203 is lifted off the template side 201 to remove any sputtered alloy from the non label area of the template side 201, the alloy that was sputtered upon the mark 205 may be similarly lifted off leaving behind a negative image of the mark 205 as illustrated with the label 210 in FIG. 8.

Some of the advantages pertaining to this negative image label 210 regard the ability of the label 210 to withstand multiple imprint lithography processes and cleaning. For example, once the imprint lithography template 200 is used to imprint a pattern on a substrate, the materials used in the lithography process are cleaned from the template 200 using relatively harsh chemicals, such as a mix of sulfuric acid and hydrogen peroxide. This metallic label 210 may withstand such chemical cleanings and provide a relatively permanent label for the imprint lithography template 200. Thus, the label 210 provides the operator with the ability to properly reference and handle the imprint lithography template 200 multiple times. Moreover, because neither the labeling process nor cleaning etches the imprint lithography template 200, the labeling process is not likely to crack the imprint lithography template 200 or produce deleterious particles that would cause future defects.

Although shown and described with respect to the imprint lithography template 200 being labeled using a particular number of steps, the invention is not intended to be so limited. Other processes may be used to provide the metallic or opaque label 210 to the template side 201. One example of another process that is used to label the imprint lithography template 200 is shown and described in FIG. 9. Moreover, the invention is not intended to be limited to labeling any particular side of the imprint lithography template 200. For example, the label 210 may be applied to a patterned front side of the imprint lithography template 200 or to an optically smooth back side of the imprint lithography template 200. A patterned side of the imprint lithography template 200 may be that side of the template 200 that is used to nano imprint an image into a substrate using a photoresist material. Opposite to the patterned side of the imprint lithography template 200 is an optically smooth side of the template 200. The optically smooth side is generally a side of the template 200 that has no embedded pattern and thus passes UV light with less dispersion and/or absorption when curing the photoresist during the lithography process.

Figure 9:
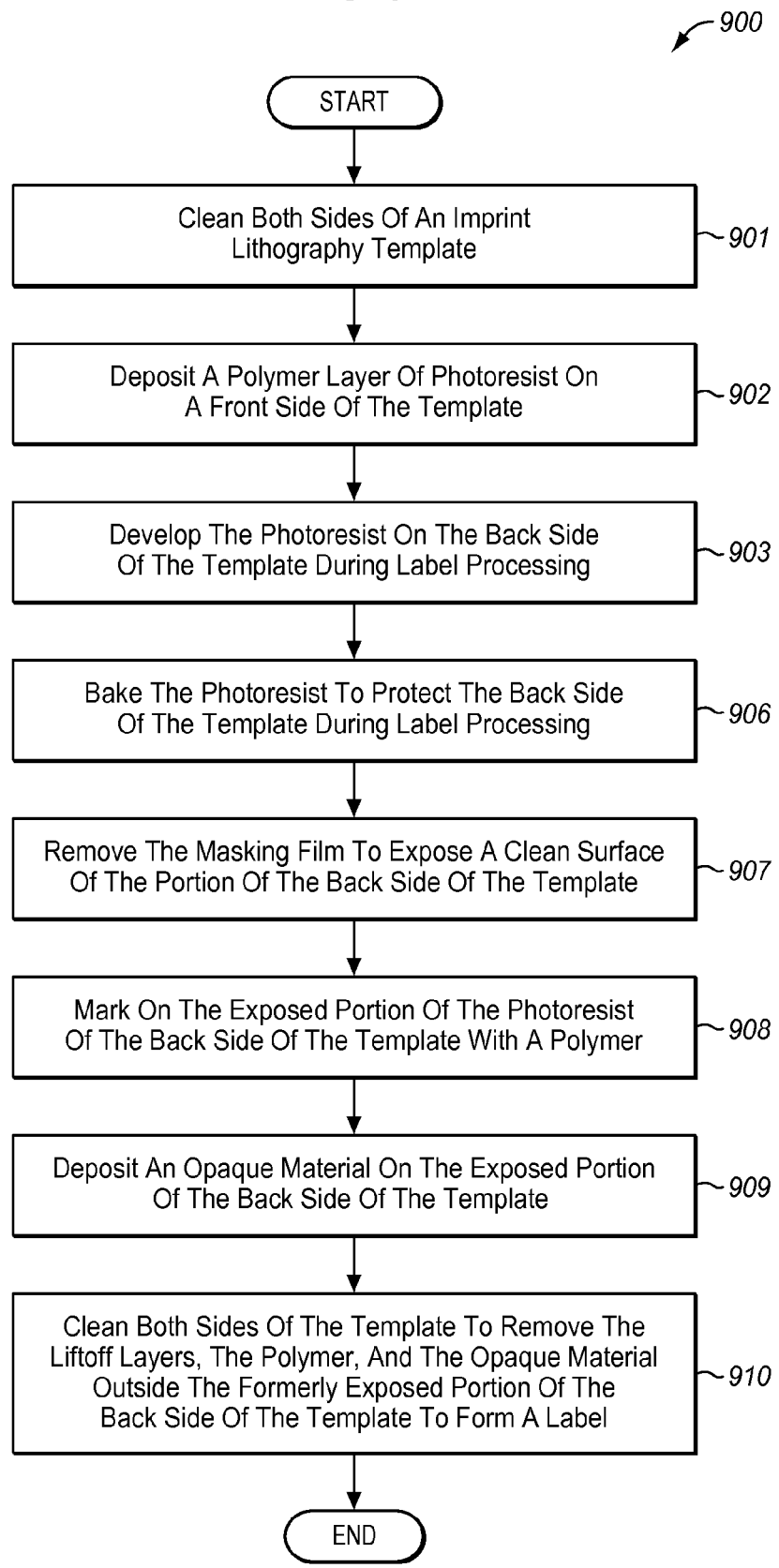
FIG. 9 is a flow chart illustrating another method of labeling an imprint lithography template in one exemplary embodiment.
Figure 10:
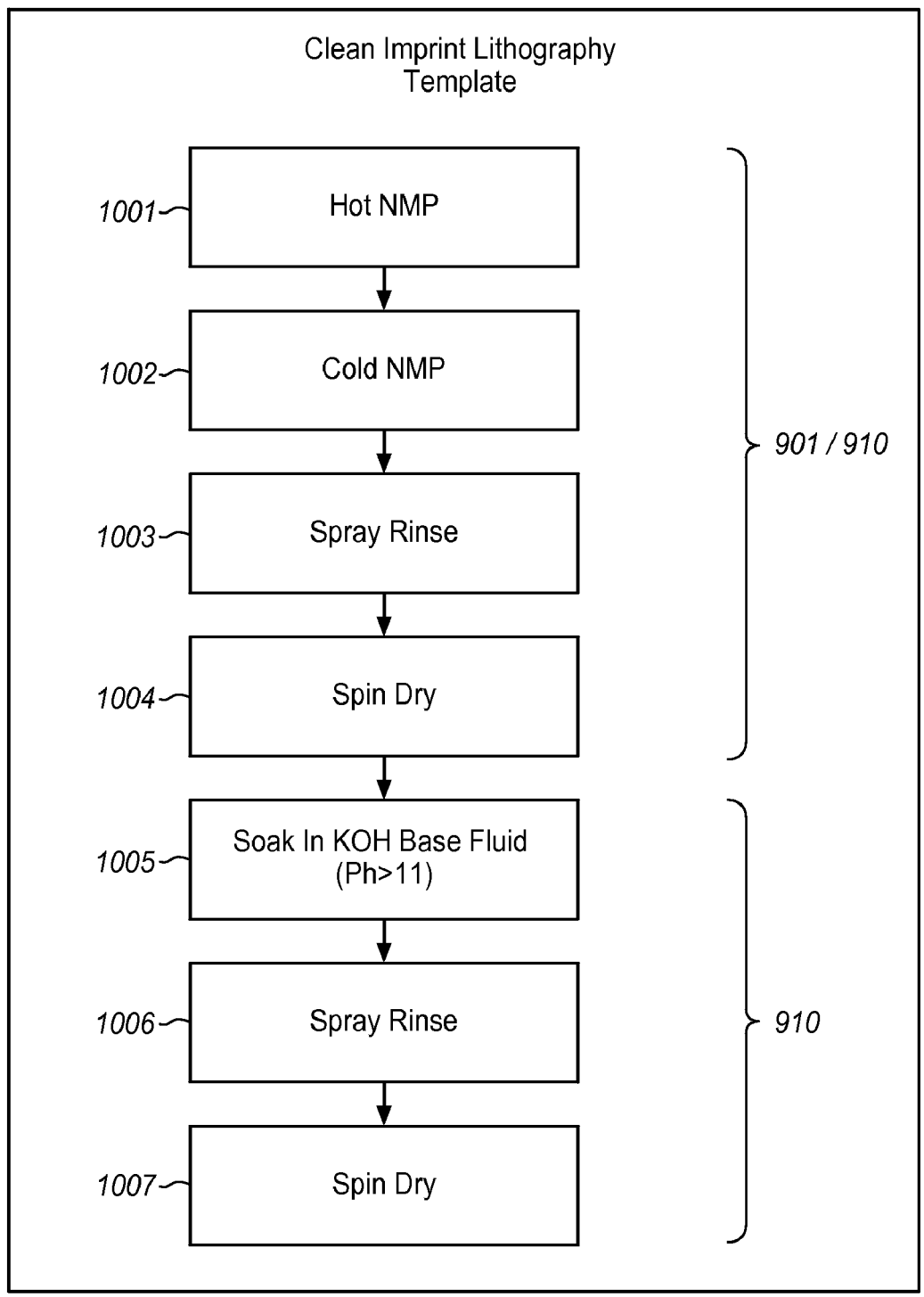
FIG. 10 illustrates cleaning steps used in labeling the imprint lithography template in one exemplary embodiment.
Figure 11:
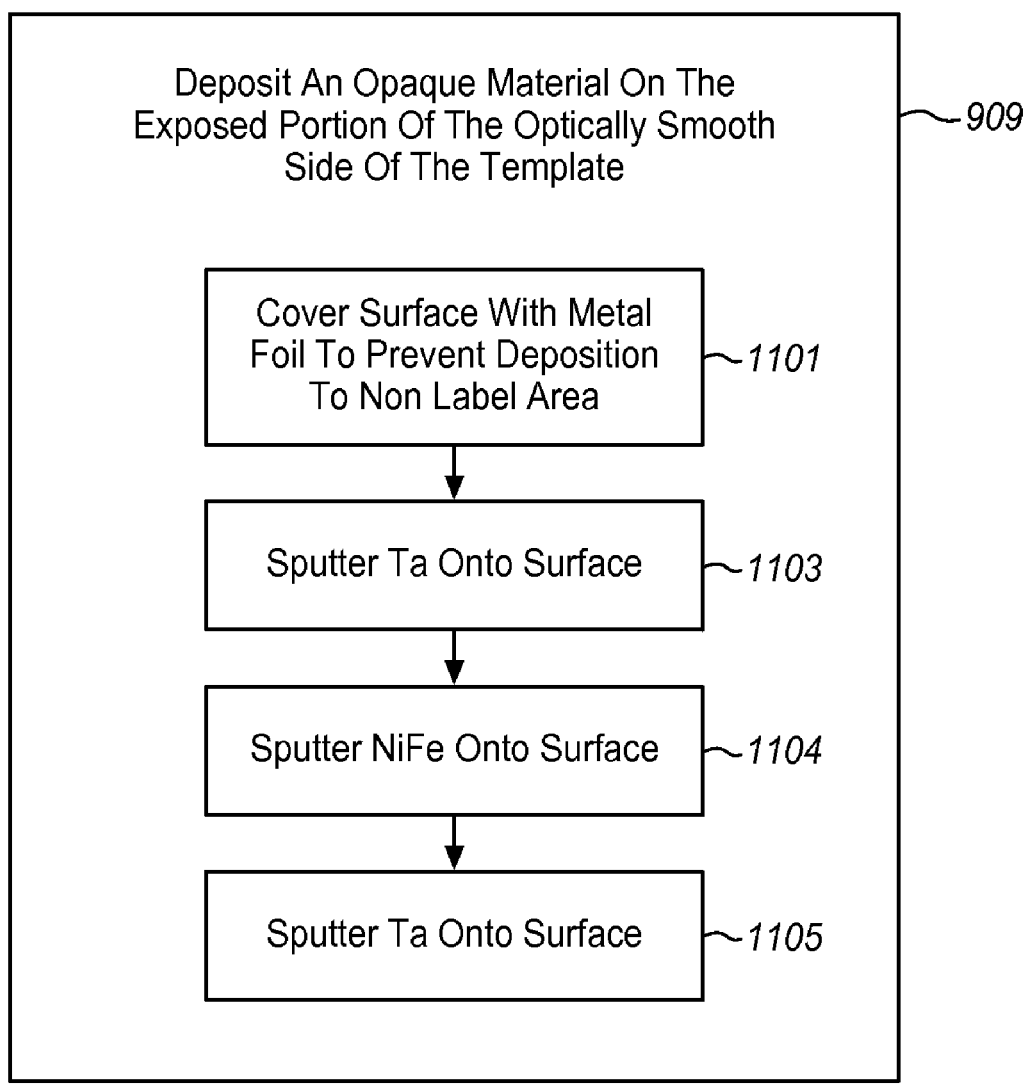
FIG. 11 illustrates label deposition steps used in labeling the imprint lithography template in one exemplary embodiment.

FIG. 9 is a flow chart illustrating another method 900 of labeling the imprint lithography template 200 in one exemplary embodiment. In this embodiment, both sides of the imprint lithography template 200 are prepared by first cleaning the imprint lithography template 200 in step 901. In doing so, both sides of the imprint lithography template may be exposed to chemical cleanings using N-methylpyrrolidinone (NMP) and isopropanol (IPA). From there, a polymer material, such as PMMA, is deposited on the patterned side of the imprint lithography template 200 in step 902. This deposition of the polymer material may include spinning the template 200 approximately 2000 revolutions per minute for about 60 seconds to leave a relatively even layer of the polymer material upon the patterned side of the imprint lithography template 200. The polymer material is then developed (e.g., by baking it at approximately 92° C. for about five minutes in step 902 to remove excess solvent on the template 200).

With the patterned side of the imprint lithography template 200 protected by a protective polymer layer of photoresist material, processing of the optically smooth back side of the imprint lithography template 200 may be performed. In this regard, a portion of the optically smooth back side of the template may be patterned with photoresist. Photoresist may be patterned on the template 200 where no portion of the underlying pattern exists such that UV light may pass through the template 200 to the underlying pattern without obstruction by the developed label 210. Thereafter, a liftoff layer of photoresist material, such as that of steps 902 and 903, may be deposited and baked on the optically smooth back side (e.g., the template side 201) of the template 200 in step 906.

After affixing the photoresist liftoff layer to the optically smooth back side of the template 200, an oxygen plasma may be used to remove any organic residue over the portion of the optically smooth side of the template 200 in step 907. A polymer mark is then affixed to the exposed portion of the optically smooth side of the template 200 using indelible ink in step 908 (e.g., via an indelible ink marker). Afterwards, an opaque material (e.g., an alloy) may be deposited on the exposed portion of the optically smooth side of the template 200 in step 909 to provide the negative image label when the template 200 is cleaned. Accordingly, both sides of the template 200 are cleaned to remove the liftoff layers (e.g., the photoresist material), the mark, and any opaque material residing outside the previously exposed portion of the optically smooth back side of the template 200. That is, the only material generally remaining on the template 200 after the labeling process is the deposited opaque material within the label area of the template.

Certain steps of the method 900 may include other features. For example, when cleaning the imprint lithography template 200, the steps 901 in 910 may include washing both sides of the template 200 with a relatively hot NMP/IPA mixture (step 1001) followed by washing the template 200 with a relatively cold NMP/IPA mixture for about two minutes (step 1002) and spray rinsing both sides of the template with water (step 1003). The steps 1001-1003 may be repeated five times and then spin dried in step 1004. In step 901, the steps 1001-1004 may be used to clean the imprint lithography template 200 prior to labeling to ensure that the materials used in the labeling process properly bond to the imprint lithography template sides. In step 910, on the other hand, the steps 1001-1004 may be used to remove the majority of the materials deposited on the optically smooth side of the template 200. For example, the steps 1001-1004 may be used to remove the photoresist materials, the indelible ink, and the deposited alloy outside the labeling area. In this regard, the step 910 may include additional cleaning steps that further ensure that such materials are removed from the template 200 prior to use in the lithography machine. For example, the step 910 may include soaking the template 200 in a bath of potassium hydroxide with a Ph greater than 11 for about 5 minutes in step 1005. The imprint lithography template 200 may then be spray rinsed in step 1006 and spin dried in step 1007 to prepare the template 200 for use within the imprint lithography machine. However, a cured imprint resist may not require any development step.

Figure 8:
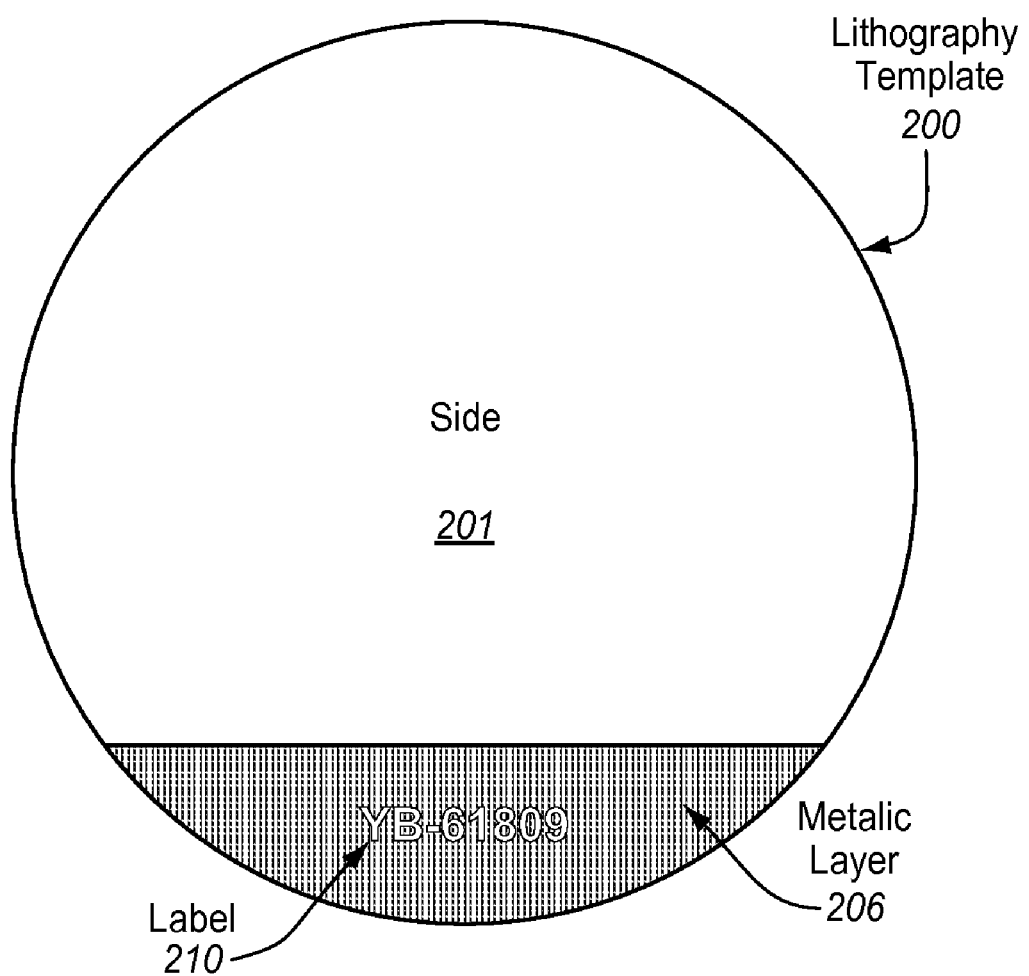

Depositing the alloy on the exposed portion of the optically smooth back side of the template 200 (i.e., step 909) may also include additional steps. For example, prior to depositing the alloy on the optically smooth back side of the template 200, the remainder of the optically smooth side of the template 200 (i.e., that portion of the optically smooth back side of the template 201 not covered with tape) may be covered with a metal foil (e.g., an aluminum foil) in step 1101 to further prevent deposition of the alloy on the remainder of the optically smooth back side of the template 200. Thereafter, the exposed portion of the optically smooth back side of the template 200 may be target cleaned to prepare the exposed portion for tantalum (Ta)/nickel iron (NiFe) sputtering. Ta is then sputtered onto the exposed portion of the optically smooth side of the template 200 at a thickness of about 50 angstroms (Å) in step 1103. NiFe is then sputtered on top of the Ta at a thickness of about 100 Å followed by sputtering Ta at a thickness of about 50 Å in steps 1104 and 1105. When the steps associated with the cleaning step 910 are performed, the Ta/NiFe/Ta sputtering leaves behind a negative image label 210 on the optically smooth side of the template 200 as shown in FIG. 8.

Although specific embodiments were described herein, the scope of the invention is not limited to those specific embodiments. For example, as long as the label 210 is being formed on the template 200 in a boundary region, the label 210 may be formed on either side of the template. In this regard, the label 210 does not impede the lithography process. Also, the embodiments described above should not be limited to merely labeling imprint lithography templates as the labeling processes may be used to label other surfaces. Accordingly, the scope of the invention is defined by the following claims and any equivalents thereof.

We claim:

1. A method of labeling a transparent imprint lithography template, wherein the imprint lithography template has first and second sides, the method comprising:
   placing a masking layer on a portion of the first side of the template;
   forming a liftoff layer on the remainder of the first side of the template;
   removing the masking layer to expose the portion of the first side of the template;
   placing a polymer mark on the exposed portion of the first side of the template;
   depositing an opaque material on the first side of the template; and
   removing the liftoff layer and the polymer mark to form a label on the first side of the template with the deposited opaque material.

2. The method of claim 1, wherein the first side of the template is an optically smooth side.

3. The method of claim 1, wherein placing a masking layer on a portion of the first side of the template comprises taping off the portion of the first side of the template with a cellophane tape.

4. The method of claim 1, wherein forming a liftoff layer on the remainder of the first side of the template comprises:
   depositing a photoresist material on the remainder of the first side of the template; and
   baking the photoresist to adhere the photoresist to the remainder of the first side of the template.

5. The method of claim 1, wherein the polymer mark comprises an indelible ink mark.

6. The method of claim 1, wherein depositing an opaque material on the first side of the template comprises: depositing a metallic material on the first side of the template by:
   cleaning the exposed portion of the first side of the template; and
   sputtering tantalum and nickel-iron on the exposed portion of the first side of the template.

7. The method of claim 1, further comprising forming a protective layer on the second side of the template.

8. The method of claim 1, wherein the polymer mark comprises: alphanumeric text;
   a barcode; a symbol; or a combination thereof.

9. The method of claim 1, wherein the opaque material is metallic.

10. The method of claim 1, wherein the second side of the template comprises a lithography pattern.

11. The method of claim 10, further comprising:
   depositing a photoresist material on the second side of the template; and
   baking the photoresist to adhere the photoresist to the second side of the template and protect the lithography pattern during label processing.

12. The method of claim 1, further comprising:
   cleaning the template with N-methylpyrrolidinone and isopropanol;
   rinsing the template; and
   spin-drying the template.

13. The method of claim 12, further comprising, in response to cleaning, rinsing, and spin-drying:
   soaking the template in a chemical solution;
   rinsing the template; and
   spin-drying the template.

14. A method of labeling an imprint lithography template, wherein the imprint lithography template has a patterned side and an optically smooth side, the method comprising:
   cleaning both sides of the template to prepare the template for label processing;
   forming a photoresist layer on the patterned side of the template to protect the pattern during the label processing;
   masking a portion of the optically smooth side of the template with cellophane tape;
   forming a photoresist layer on the remainder of the optically smooth side of template to protect the remainder of the optically smooth side of the template during the label processing;
   removing the cellophane tape and tape residue to expose the portion of the optically smooth side of the template;
   placing a polymer mark on the exposed portion of the optically smooth side of the template;
   depositing an opaque layer on the exposed portion of the optically smooth side of the template; and
   cleaning both sides of the template to remove the photoresist layers and the polymer mark to reveal a label with the deposited opaque layer.

15. The method of claim 14, wherein the photoresist layers deposited on both sides of the template comprises polymethyl methacrylate.

16. The method of claim 14, wherein depositing an opaque layer on the exposed portion of the optically smooth side of the template comprises: depositing a metallic layer on the exposed portion of the optically smooth side of the template by sputtering tantalum and nickel-iron on the exposed portion of the optically smooth side of the template.

17. The method of claim 16, wherein sputtering tantalum and nickel-iron on the exposed portion of the optically smooth side of the template comprises:
   sputtering a first tantalum layer of about 50 angstroms on the exposed portion of the optically smooth side of the template;
   sputtering a nickel-iron layer of about 100 angstroms on the first tantalum layer; and
   sputtering a second tantalum layer of about 50 angstroms on the nickel-iron layer.

18. The method of claim 14, wherein cleaning both sides of the template to prepare the template for label processing comprises:
   cleaning the template with N-methylpyrrolidinone and isopropanol;
   rinsing the template; and
   spin-drying the template.

19. The method of claim 18, further comprising, in response to cleaning, rinsing, and spin-drying:
   soaking the template in a chemical solution;
   rinsing the template; and
   spin-drying the template.

\* \* \* \* \*